(12) United States Patent
Fujita

(10) Patent No.: US 11,908,822 B2
(45) Date of Patent: Feb. 20, 2024

(54) POWER SEMICONDUCTOR MODULE AND POWER CONVERSION APPARATUS

(71) Applicant: Mitsubishi Electric Corporation, Tokyo (JP)

(72) Inventor: Jun Fujita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 227 days.

(21) Appl. No.: 17/429,633

(22) PCT Filed: Apr. 9, 2019

(86) PCT No.: PCT/JP2019/015471
§ 371 (c)(1),
(2) Date: Aug. 10, 2021

(87) PCT Pub. No.: WO2020/208713
PCT Pub. Date: Oct. 15, 2020

(65) Prior Publication Data
US 2022/0108969 A1  Apr. 7, 2022

(51) Int. Cl.
*H01L 23/00* (2006.01)
*H01L 21/52* (2006.01)
*H01L 23/31* (2006.01)
*H01L 23/367* (2006.01)
*H01L 23/498* (2006.01)

(52) U.S. Cl.
CPC ............ *H01L 24/32* (2013.01); *H01L 21/52* (2013.01); *H01L 23/3107* (2013.01); *H01L 23/367* (2013.01); *H01L 23/49838* (2013.01); *H01L 24/48* (2013.01); *H01L 2224/32225* (2013.01); *H01L 2224/32245* (2013.01); *H01L 2224/48091* (2013.01); *H01L 2224/48227* (2013.01)

(58) Field of Classification Search
CPC ... H01L 23/367; H01L 21/52; H01L 23/3107; H01L 23/49838; H01L 24/48
USPC ........................................................ 257/734
See application file for complete search history.

(56) References Cited

U.S. PATENT DOCUMENTS

2016/0300770 A1*  10/2016  Taya ...................... H01L 24/84

FOREIGN PATENT DOCUMENTS

JP            2008-041707 A       2/2008

OTHER PUBLICATIONS

International Search Report and Written Opinion dated Jun. 11, 2019, received for PCT Application PCT/JP2019/015471, Filed on Apr. 9, 2019, 9 pages including English Translation.

* cited by examiner

*Primary Examiner* — Jasmine J Clark
(74) *Attorney, Agent, or Firm* — XSENSUS LLP

(57) ABSTRACT

A power semiconductor module includes a circuit substrate, a power semiconductor device including a semiconductor substrate, and at least one bonding portion. The at least one bonding portion includes a first metal member distal to the semiconductor substrate, a second metal member proximal to the semiconductor substrate, and a bonding layer that bonds the first metal member and the second metal member to each other. At an identical temperature, 0.2% offset yield strength of the first metal member is smaller than the 0.2% offset yield strength of the second metal member and is smaller than shear strength of the bonding layer.

9 Claims, 6 Drawing Sheets

POWER SEMICONDUCTOR MODULE AND POWER CONVERSION APPARATUS

CROSS-REFERENCE TO RELATED APPLICATION

The present application is based on PCT filing PCT/JP2019/015471, filed Apr. 9, 2019, the entire contents of which are incorporated herein by reference.

TECHNICAL FIELD

The present invention relates to a power semiconductor module and a power conversion apparatus.

BACKGROUND ART

Japanese Patent Laying-Open No. 2008-41707 (PTL 1) discloses a semiconductor device including a semiconductor device, a metal substrate, and a bonding layer that bonds the semiconductor device to the metal substrate. In the semiconductor device, at the identical temperature, 0.2% offset yield strength of the bonding layer is greater than or equal to the 0.2% offset yield strength of the metal substrate.

CITATION LIST

Patent Literature

PTL 1: Japanese Patent Laying-Open No. 2008-41707

SUMMARY OF INVENTION

Technical Problem

An object of the present invention is to extend lives of a power semiconductor module and a power conversion apparatus.

Solution to Problem

A power semiconductor module according to one aspect of the present invention includes a circuit substrate, a power semiconductor device including a semiconductor substrate, and at least one bonding portion. The at least one bonding portion includes a first metal member distal to the semiconductor substrate, a second metal member proximal to the semiconductor substrate, and a bonding layer that bonds the first metal member and the second metal member to each other. At an identical temperature, 0.2% offset yield strength of the first metal member is smaller than the 0.2% offset yield strength of the second metal member and is smaller than shear strength of the bonding layer.

A power conversion apparatus according to another aspect of the present invention includes a main conversion circuit and a control circuit. The main conversion circuit includes the power semiconductor module of the present invention, and converts input power and outputs the converted power. The control circuit outputs a control signal for controlling the main conversion circuit to the main conversion circuit.

Advantageous Effects of Invention

The 0.2% offset yield strength of the first metal member is smaller than the 0.2% offset yield strength of the second metal member and is smaller than the shear strength of the bonding layer. Therefore, even when a thermal cycle is applied to the power semiconductor module, a crack is selectively generated in the first metal member distal to the semiconductor substrate. The crack is prevented from developing to the power semiconductor device through the bonding layer. The occurrence of the crack can be prevented in the power semiconductor device. According to the power semiconductor module and the power conversion apparatus of the present invention, the lives of the power semiconductor module and the power conversion apparatus can be extended.

DESCRIPTION OF EMBODIMENTS

Figure 1:
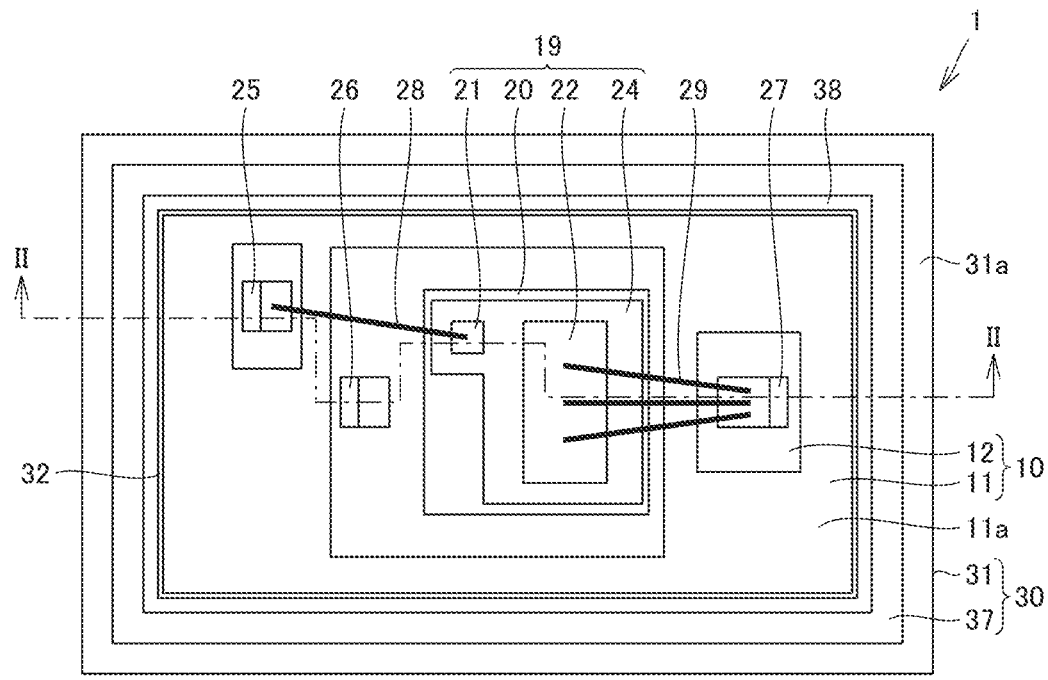
FIG. 1 is a schematic plan view illustrating a power semiconductor module according to a first embodiment.

Hereinafter, embodiments of the present invention will be described. The same components are designated by the same reference numerals, and the overlapping description will be omitted.

First Embodiment

Figure 2:
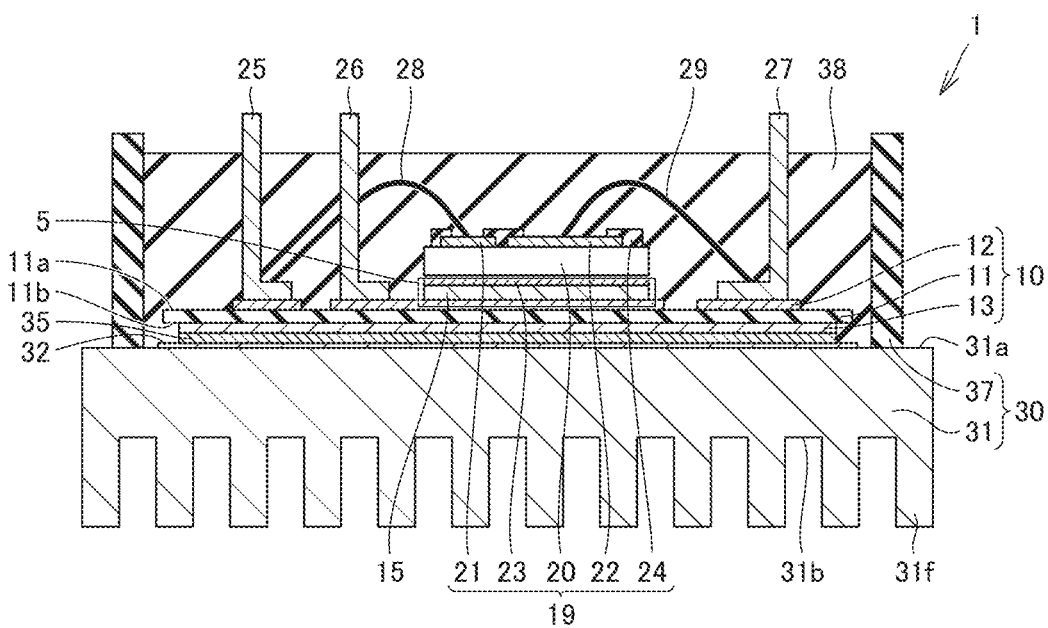
FIG. 2 is a schematic sectional view illustrating the power semiconductor module of the first embodiment, taken along a line II-II in FIG. 1.

Referring to FIGS. 1 and 2, a power semiconductor module 1 according to a first embodiment will be described. Power semiconductor module 1 mainly includes a circuit substrate 10, a power semiconductor device 19, and at least one bonding portion (first bonding portion 5).

Circuit substrate 10 includes a circuit pattern 12. Circuit substrate 10 may further include an insulating substrate 11. Circuit substrate 10 may further include a back conductor layer 13.

Insulating substrate 11 includes a first principal surface 11a opposite to power semiconductor device 19 and a second principal surface 11b on an opposite side of first principal surface 11a. For example, insulating substrate 11 is formed of an inorganic ceramic material such as alumina ($Al_2O_3$), aluminum nitride (AlN), silicon nitride ($Si_3N_4$), silicon dioxide ($SiO_2$), or boron nitride (BN). Insulating substrate 11 may be an insulating resin substrate such as a glass epoxy substrate.

Circuit pattern 12 is provided on first principal surface 11a of insulating substrate 11. For example, circuit pattern 12 is formed of a conductive metal material such as Al, AlSi, AlCu, or AlSiCu. For example, circuit pattern 12 may have a thickness greater than or equal to 0.1 mm and less than or equal to 1.0 mm. Back conductor layer 13 is provided on second principal surface 11b of insulating substrate 11. Back conductor layer 13 is not particularly limited, but is formed of a metal laminate in which Al foil and Cu foil are laminated on each other. The Al foil of back conductor layer 13 is provided between the Cu foil of back conductor layer 13 and insulating substrate 11. Back conductor layer 13 may be a single layer. For example, back conductor layer 13 may have a thickness greater than or equal to 0.1 mm and less than or equal to 0.6 mm.

Power semiconductor device 19 is not particularly limited, but is a vertical metal-oxide-semiconductor field effect transistor (MOSFET). Power semiconductor device 19 may be a lateral MOSFET, an insulated gate bipolar transistor (IGBT), or the like. Power semiconductor device 19 includes a semiconductor substrate 20. Semiconductor substrate 20 includes a first surface opposite to circuit pattern 12 and a second surface on the opposite side of the first surface. The first surface may be a back surface of semiconductor substrate 20, and the second surface may be a front surface of semiconductor substrate 20. For example, semiconductor substrate 20 is formed of silicon (Si) or a wide band gap semiconductor material such as silicon carbide (SiC), gallium nitride (GaN), or diamond.

Power semiconductor device 19 further includes a first electrode opposite to circuit pattern 12. The first electrode may be a drain electrode 23. The first electrode (drain electrode 23) is provided on the first surface of semiconductor substrate 20. Power semiconductor device 19 further includes a second electrode provided on a distal side from circuit substrate 10. The second electrode may include a gate electrode 21 and a source electrode 22. The second electrode (gate electrode 21 and source electrode 22) is provided on the second surface of semiconductor substrate 20. The first electrode (drain electrode 23) and the second electrode (gate electrode 21 and source electrode 22) are made of a conductive metal material such as AlSi, AlCu, AlSiCu, or Cu. For example, the first electrode (drain electrode 23) and the second electrode (gate electrode 21 and source electrode 22) may have a thickness greater than or equal to 2 μm and less than or equal to 10 μm.

A barrier metal layer (not illustrated) such as a Ti layer may be provided on the surface of the second electrode (gate electrode 21 and source electrode 22) opposite to semiconductor substrate 20. A silicide film such as a NiSi film may be provided between semiconductor substrate 20 and the first electrode (drain electrode 23).

Power semiconductor device 19 may further include an insulation film 24. Insulation film 24 is provided on the second surface of semiconductor substrate 20. Insulation film 24 is formed on an outer edge of the second electrode (gate electrode 21 and source electrode 22) and between gate electrode 21 and source electrode 22. Insulation film 24 improves electric insulation between the gate electrode 21 and the source electrode 22. For example, insulation film 24 is formed of an insulating resin such as polyimide.

Power semiconductor device 19 is mounted on circuit pattern 12. Power semiconductor device 19 is bonded to circuit pattern 12 by a first bonding layer 15. Specifically, the first electrode (drain electrode 23) of power semiconductor device 19 is bonded to circuit pattern 12 by first bonding layer 15.

The at least one bonding portion includes a first metal member distal to semiconductor substrate 20, a second metal member proximal to semiconductor substrate 20, and a bonding layer that bonds the first metal member and the second metal member to each other. Specifically, the at least one bonding portion includes first bonding portion 5. The first metal member is circuit pattern 12, the second metal member is the first electrode (drain electrode 23), and the bonding layer is first bonding layer 15. That is, first bonding portion 5 includes a circuit pattern 12 distal to semiconductor substrate 20, the first electrode (drain electrode 23) proximal to semiconductor substrate 20, and first bonding layer 15 that bonds circuit pattern 12 and the first electrode (drain electrode 23) to each other.

At the identical temperature, the 0.2% offset yield strength of the first metal member (circuit pattern 12) is smaller than the 0.2% offset yield strength of the second metal member (first electrode (drain electrode 23)). Table 1 illustrates the 0.2% offset yield strength of the metal material measured at room temperature. In Table 1, AlSi (Si 1 wt %) is an AlSi alloy containing 1 wt % of Si. AlCu (Cu 0.5 wt %) is an AlCu alloy containing 0.5 wt % of Cu. AlSiCu (Si 1 wt %, Cu 0.5 wt %) is an AlSiCu alloy containing 1 wt % of Si and 0.5 wt % of Cu. In general, the 0.2% offset yield strength of a material is an indicator of a tensile fracture strength of the material. A magnitude relationship between the 0.2% offset yield strength of the first metal member and the 0.2% offset yield strength of the second metal member does not change in an operating temperature range (for example, greater than or equal to −55° C. and less than 300° C.) of power semiconductor module 1. In the specification, the operating temperature range of power semiconductor module 1 means a temperature range of power semiconductor module 1 during operation or stop of power semiconductor device 19.

TABLE 1

| Metal material | Al | AlSi (Si 1 wt %) | AlCu (Cu 0.5 wt %) | AlSiCu (Si 1 wt %, Cu 0.5 wt %) | Cu |
|---|---|---|---|---|---|
| 0.2% offset yield strength (MPa) | 30 | 45 | 50 | 90 | 200 |

Referring to Table 1, examples of a combination of metal materials applicable to the first metal member (circuit pattern 12) and the second metal member (first electrode (drain electrode 23)) are as follows. When the first metal member (circuit pattern 12) is made of Al, the second metal member (first electrode (drain electrode 23)) can be made of AlSi, AlCu, AlSiCu, or Cu. When the first metal member (circuit pattern 12) is made of AlSi, the second metal member (first electrode (drain electrode 23)) can be made of AlCu, AlSiCu, or Cu. When the first metal member (circuit pattern 12) is made of AlCu, the second metal member (first electrode (drain electrode 23)) can be made of AlSiCu or Cu. When the first metal member (circuit pattern 12) is made of AlSiCu, the second metal member (first electrode (drain electrode 23)) can be made of Cu. In an example of the first embodiment, the first metal member (circuit pattern 12) is formed of Al and has the 0.2% offset yield strength of 30 MPa at room temperature, and the second metal member (first electrode (drain electrode 23)) is formed of AlSi (Si 1 wt %) and has the 0.2% offset yield strength of 45 MPa at room temperature.

At the identical temperature, the 0.2% offset yield strength of the first metal member (circuit pattern 12) is smaller than the shear strength of the bonding layer (first bonding layer 15). Specifically, at the identical temperature, the 0.2% offset yield strength of the second metal member (first electrode (drain electrode 23)) may be larger than the shear strength of the bonding layer (first bonding layer 15). The bonding layer (first bonding layer 15) is not particularly limited, but may be formed of a metal nanoparticle sintered body. For example, the metal nanoparticle has a diameter less than or equal to 10 nm. The bonding layer (first bonding layer 15) formed of the metal nanoparticle sintered body does not contain a void greater than or equal to 0.1 μm. For example, the metal nanoparticle sintered body is obtained by sintering metal nanoparticles such as silver nanoparticles or copper nanoparticles at a low temperature less than or equal to 300° C. in an air atmosphere or a nitrogen atmosphere.

In an example of the first embodiment, the first metal member (circuit pattern 12) is formed of Al and has the 0.2% offset yield strength of 30 MPa at room temperature, and the bonding layer (first bonding layer 15) is formed of a silver nanoparticle sintered body and has the shear strength more than 30 MPa and less than or equal to 40 MPa at room temperature. For example, the silver nanoparticle sintered body having the shear strength more than 30 MPa and less than or equal to 40 MPa is obtained by sintering silver nanoparticles at a temperature greater than or equal to 250° C. and less than or equal to 300° C. The magnitude relationship between the 0.2% offset yield strength of the first metal member and the shear strength of the bonding layer (first bonding layer 15) does not change in the operating temperature range (for example, greater than or equal to −55° C. and less than 300° C.) of power semiconductor module 1.

When the sintering temperature of the metal nanoparticles changes, denseness (porosity) of the metal nanoparticle sintered body also changes. For this reason, the shear strength of the metal nanoparticle sintered body can be adjusted by adjusting the sintering temperature of the metal nanoparticles. When a load applied to the silver nanoparticles during sintering of the metal nanoparticles changes, the denseness (porosity) of the metal nanoparticle sintered body also changes. For this reason, the shear strength of the metal nanoparticle sintered body may be adjusted by adjusting the load.

For example, the bonding layer (first bonding layer 15) may have a thickness greater than or equal to 20 μm, or may have a thickness greater than or equal to 35 μm. For this reason, mechanical strength of the bonding layer (first bonding layer 15) is improved, and the generation of the crack can be prevented in the bonding layer (first bonding layer 15). Even when the thermal cycle is applied to power semiconductor module 1, the crack can be selectively generated in the first metal member (circuit pattern 12) distal to semiconductor substrate 20. For example, the bonding layer (first bonding layer 15) may have a thickness less than or equal to 100 μm, or may have a thickness less than or equal to 50 μm. An increase in cost of power semiconductor module 1 can be prevented because there is no necessity to form a special bonding layer (first bonding layer 15).

Power semiconductor module 1 may further include lead terminals 25, 26, 27. For example, lead terminals 25, 26, 27 are formed of a metal material such as Cu or Al. Lead terminals 25, 26, 27 are bonded to circuit pattern 12. Specifically, lead terminals 25, 26, 27 are ultrasonically bonded to circuit pattern 12. Lead terminal 26 is electrically connected to the first electrode (drain electrode 23) of power semiconductor device 19 through circuit pattern 12. Lead terminal 26 may be a drain terminal.

Power semiconductor module 1 may further include conductive wires 28, 29. Conductive wires 28, 29 are made of a metal material such as Al or Cu. Conductive wires 28, 29 may be formed of the same metal material. For example, conductive wires 28, 29 may be made of Al. Conductive wires 28, 29 may be formed of materials different from each other. Conductive wire 28 may be formed of Cu, and conductive wire 29 may be formed of Al.

Lead terminal 25 is electrically connected to the second electrode (gate electrode 21) of power semiconductor device 19 through conductive wire 28. Lead terminal 25 may be a gate terminal. Lead terminal 27 is electrically connected to the second electrode (source electrode 22) of power semiconductor device 19 through conductive wire 29. Lead terminal 27 may be a source terminal. In power semiconductor device 19, current flowing through source electrode 22 is larger than the current flowing through gate electrode 21. For this reason, conductive wire 29 may have a diameter larger than that of conductive wire 28. The number of conductive wires 29 may be larger than the number of conductive wires 28.

Power semiconductor module 1 may further include a case 30. Case 30 accommodates power semiconductor device 19 and circuit substrate 10. Case 30 may include a heat dissipation member 31 and an enclosure 37. Circuit substrate 10 is bonded to heat dissipation member 31. Heat dissipation member 31 radiates heat generated by power semiconductor device 19 to an outside of power semiconductor module 1. For example, heat dissipation member 31 may be formed of a metal material such as aluminum.

Specifically, heat dissipation member 31 includes a third principal surface 31a facing circuit substrate 10 and a fourth principal surface 31b opposite to third principal surface 31a. A metal overlay layer 32 is provided on third principal surface 31a of heat dissipation member 31. Metal overlay layer 32 may be a Ni—P plating layer. Back conductor layer 13 of circuit substrate 10 and metal overlay layer 32 are bonded to each other by a solder layer 35. For example, solder layer 35 may be formed of SnAgCu-based lead-free solder. Heat dissipation member 31 may include a plurality of fins 31f. The plurality of fins 31f protrude from fourth principal surface 31b. The plurality of fins 31f increase heat radiation capability of heat dissipation member 31.

Enclosure 37 is fixed to heat dissipation member 31 using a fixing member such as a screw or an adhesive. Enclosure 37 may be formed of an insulating resin such as a polyphenylene sulfide (PPS) resin, an epoxy resin, a polyimide resin, or an acrylic resin.

A sealing member 38 is provided in at least a part of an inner space of case 30. Sealing member 38 seals power semiconductor device 19. Sealing member 38 may further seal ends of lead terminals 25, 26, 27 connected to circuit pattern 12. Sealing member 38 may further seal circuit substrate 10. For example, sealing member 38 may be formed of an insulating resin such as a silicone resin, an epoxy resin, a urethane resin, a polyimide resin, a polyamide resin, or an acrylic resin.

Sealing member 38 may contain a filler such as fine particles. The filler may be dispersed in an insulating resin. For example, the filler may be formed of an inorganic ceramic material such as silica ($SiO_2$), alumina ($Al_2O_3$), aluminum nitride (AlN), boron nitride (BN), silicon nitride ($Si_3N_4$), diamond (C), silicon carbide (SiC), or boron oxide ($B_2O_3$). A thermal expansion coefficient of sealing member 38 can be adjusted by adding the filler into the insulating resin. The filler may have thermal conductivity higher than that of the insulating resin material that is a main component of sealing member 38, and may improve the thermal conductivity of sealing member 38.

With reference to FIGS. 1 to 7, a method for manufacturing power semiconductor module 1 of the first embodiment will be described.

Figure 3:
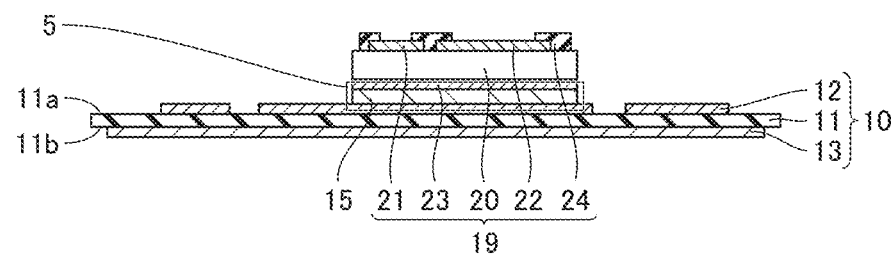
FIG. 3 is a schematic sectional view illustrating one process of a method for manufacturing the power semiconductor module of the first embodiment.

As illustrated in FIG. 3, the method for manufacturing power semiconductor module 1 of the first embodiment includes bonding power semiconductor device 19 to circuit pattern 12 using first bonding layer 15. Specifically, a metal nanoparticle paste such as a silver nanoparticle paste is applied onto circuit pattern 12. For example, the metal nanoparticle paste has a thickness greater than or equal to 20 µm and less than or equal to 100 µm. For example, the metal nanoparticle paste is calcined at a first temperature greater than or equal to 100° C. and less than or equal to 200° C. to obtain a metal nanoparticle calcined body.

Power semiconductor device 19 is placed on the metal nanoparticle calcined body. The first electrode (drain electrode 23) of power semiconductor device 19 is in contact with the metal nanoparticle calcined body. A load is applied to power semiconductor device 19 to position power semiconductor device 19 with respect to the metal nanoparticle calcined body. For example, the load is greater than or equal to 1 MPa and less than or equal to 10 MPa. The application of the load to power semiconductor device 19 is stopped. For example, the metal nanoparticle calcined body is sintered at a second temperature higher than the first temperature to obtain first bonding layer 15 formed of the metal nanoparticle sintered body. For example, the second temperature may be less than or equal to 300° C., or less than or equal to 250° C. For example, the sintering time at the second temperature is greater than or equal to 5 minutes and less than or equal to 60 minutes. In this way, the first electrode (drain electrode 23) of power semiconductor device 19 is bonded to circuit pattern 12 using first bonding layer 15.

Figure 4:
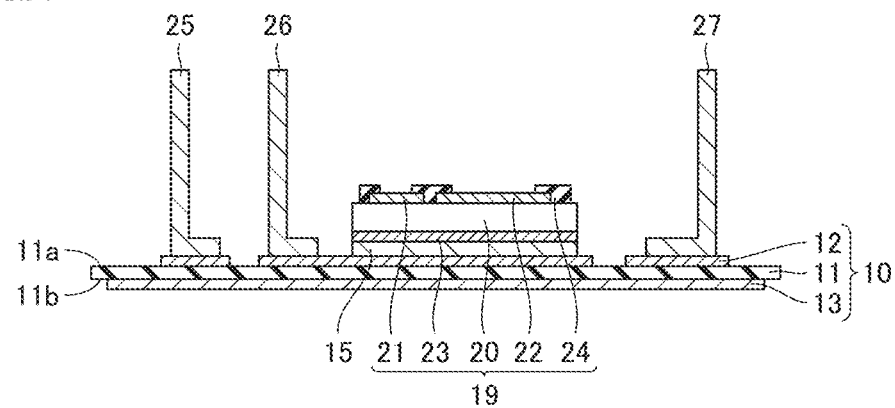
FIG. 4 is a schematic sectional view illustrating a process subsequent to the process in FIG. 3 in the method for manufacturing the power semiconductor module of the first embodiment.
Figure 5:
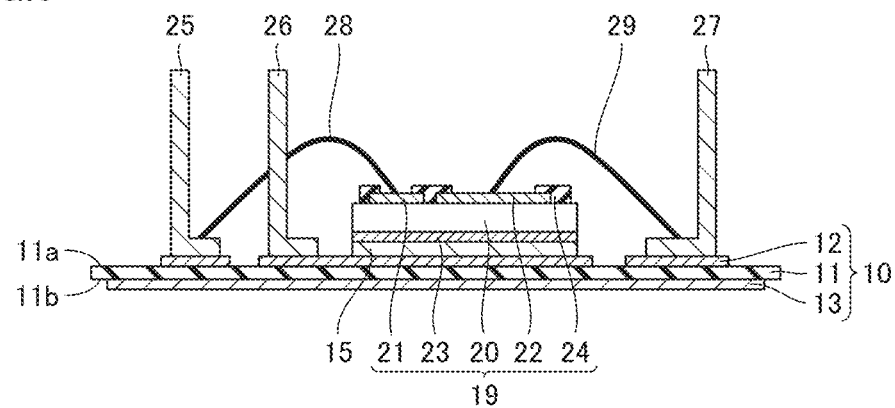
FIG. 5 is a schematic sectional view illustrating a step subsequent to the step in FIG. 4 in the method for manufacturing the power semiconductor module of the first embodiment.

As illustrated in FIG. 4, the method for manufacturing power semiconductor module 1 of the first embodiment includes bonding lead terminals 25, 26, 27 to circuit pattern 12. Specifically, lead terminals 25, 26, 27 are ultrasonically bonded to circuit pattern 12. As illustrated in FIG. 5, the method for manufacturing power semiconductor module 1 of the first embodiment includes bonding conductive wires 28, 29 to the second electrode (gate electrode 21 and source electrode 22) of power semiconductor device 19 and lead terminals 25, 27. Conductive wires 28, 29 may be bonded using a wedge wire bonder.

Figure 6:
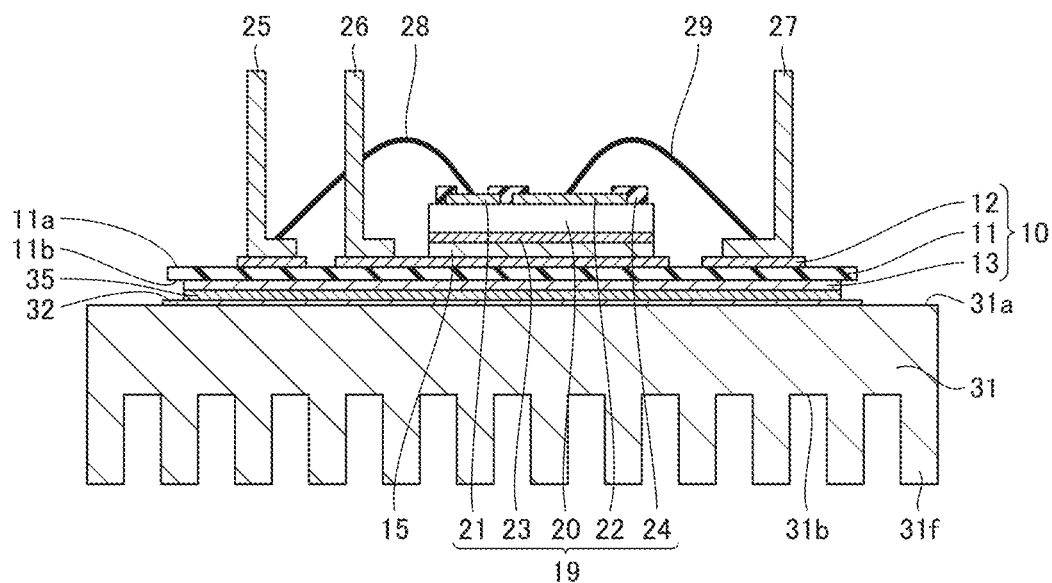
FIG. 6 is a schematic sectional view illustrating a step subsequent to the step in FIG. 5 in the method for manufacturing the power semiconductor module of the first embodiment.
Figure 7:
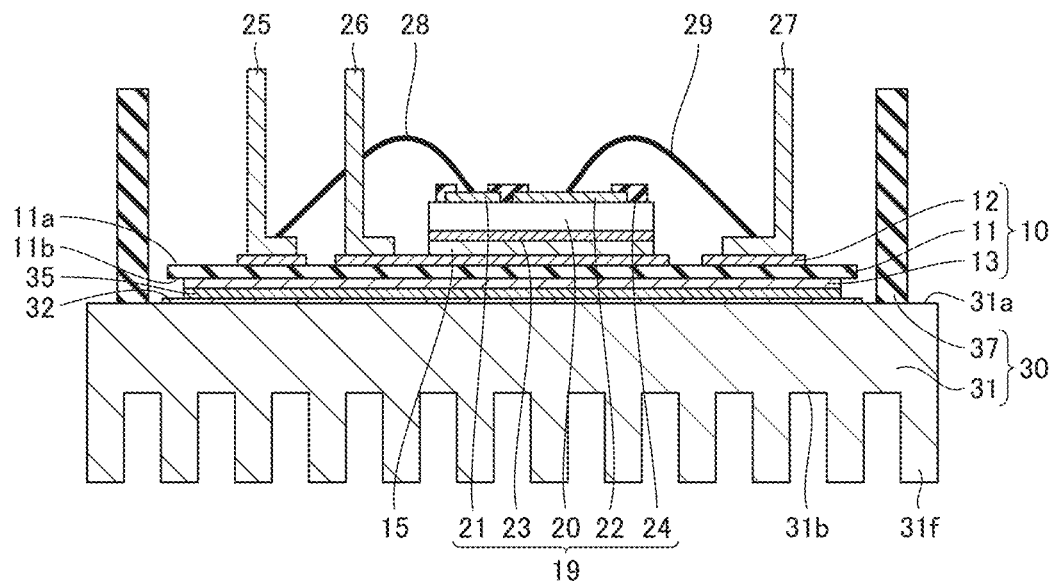
FIG. 7 is a schematic sectional view illustrating a step subsequent to the step in FIG. 6 in the method for manufacturing the power semiconductor module of the first embodiment.

As illustrated in FIGS. 6 and 7, the method for manufacturing power semiconductor module 1 of the first embodiment includes accommodating power semiconductor device 19 and circuit substrate 10 in case 30. Specifically, as illustrated in FIG. 6, circuit substrate 10 is bonded to heat dissipation member 31. Specifically, back conductor layer 13 of circuit substrate 10 and metal overlay layer 32 provided on third principal surface 31a of heat dissipation member 31 are bonded to each other by solder layer 35. Then, as illustrated in FIG. 7, enclosure 37 is fixed to heat dissipation member 31. Specifically, enclosure 37 is fixed to heat dissipation member 31 using an adhesive and a screw.

Then, the method for manufacturing the power semiconductor module 1 of the first embodiment includes sealing power semiconductor device 19 using sealing member 38. Specifically, the sealing material is supplied to at least a part of the internal space of case 30. The sealing material is subjected to a defoaming treatment. The sealing material is heated to cure. In this way, sealing member 38 that seals power semiconductor device 19 is obtained. Sealing member 38 may further seal ends of lead terminals 25, 26, 27 connected to circuit pattern 12. Sealing member 38 may further seal circuit substrate 10. In this way, power semiconductor module 1 in FIGS. 1 and 2 is obtained.

An effect of power semiconductor module 1 of the first embodiment will be described.

Power semiconductor module 1 of the first embodiment includes circuit substrate 10, power semiconductor device 19 including semiconductor substrate 20, and the at least one bonding portion (first bonding portion 5). The at least one bonding portion (first bonding portion 5) includes the first metal member (circuit pattern 12) distal to semiconductor substrate 20, the second metal member (first electrode (drain electrode 23)) proximal to semiconductor substrate 20, and the bonding layer (first bonding layer 15) that bonds the first metal member (circuit pattern 12) and the second metal member (first electrode (drain electrode 23)) to each other. At the identical temperature, the 0.2% offset yield strength of the first metal member (circuit pattern 12) is smaller than the 0.2% offset yield strength of the second metal member (first electrode (drain electrode 23)) and is smaller than the shear strength of the bonding layer (first bonding layer 15).

When power semiconductor device 19 operates, the temperature of power semiconductor module 1 rises, and the first metal member (circuit pattern 12) and the second metal member (first electrode (drain electrode 23)) thermally expand. When the temperature of power semiconductor module 1 rises, it can be considered that tensile stress is applied to the first metal member (circuit pattern 12) and the second metal member (first electrode (drain electrode 23)). When the first metal member (circuit pattern 12) is made of a material different from a material of the second metal member (first electrode (drain electrode 23)), the thermal expansion coefficient of the first metal member (circuit pattern 12) is different from the thermal expansion coefficient of the second metal member (first electrode (drain electrode 23)). Shear stress acts on the bonding layer (first bonding layer 15) because the bonding layer (first bonding layer 15) is disposed between the first metal member (circuit pattern 12) and the second metal member (first electrode (drain electrode 23)).

The 0.2% offset yield strength of the first metal member (circuit pattern 12) is smaller than the 0.2% offset yield strength of the second metal member (first electrode (drain electrode 23)) and is smaller than the shear strength of the bonding layer (first bonding layer 15). For this reason, even when the thermal cycle is applied to power semiconductor module 1, a crack selectively occurs in the first metal member (circuit pattern 12) distal to semiconductor substrate 20. The crack is prevented from developing to power semiconductor device 19 through the bonding layer (first bonding layer 15). In this way, the generation of the crack can be prevented in power semiconductor device 19. The life of power semiconductor module 1 can be extended.

In power semiconductor module 1 of the first embodiment, the 0.2% offset yield strength of the second metal member (first electrode (drain electrode 23)) may be larger than the shear strength of the bonding layer (first bonding layer 15) at the identical temperature. For this reason, even when a crack is generated in the first metal member (circuit pattern 12) distal to semiconductor substrate 20, the second metal member (first electrode (drain electrode 23)) can prevent the crack from developing to power semiconductor device 19. In this way, the generation of the crack can be prevented in power semiconductor device 19. The life of power semiconductor module 1 can be extended.

In power semiconductor module 1 of the first embodiment, circuit substrate 10 includes circuit pattern 12. Power semiconductor device 19 further includes a first electrode (drain electrode 23) opposite to circuit pattern 12. The at least one bonding portion includes first bonding portion 5. First bonding portion 5 includes circuit pattern 12 as the first metal member, the first electrode (drain electrode 23) as the second metal member, and first bonding layer 15 as the bonding layer. For this reason, even when the thermal cycle is applied to power semiconductor module 1, the crack is selectively generated in circuit pattern 12 distal to semiconductor substrate 20. The crack is prevented from developing to semiconductor substrate 20 of power semiconductor device 19 through first bonding layer 15 and the first electrode (drain electrode 23). In this way, the generation of the crack can be prevented in power semiconductor device 19. The life of power semiconductor module 1 can be extended.

In power semiconductor module 1 of the first embodiment, the bonding layer (first bonding layer 15) is formed of the metal nanoparticle sintered body. The shear strength of the metal nanoparticle sintered body can be adjusted by adjusting the sintering temperature and the like of the metal nanoparticles. The bonding layer (first bonding layer 15) formed of the metal nanoparticle sintered body can expand options of materials of the first metal member (circuit pattern 12) and the second metal member (first electrode (drain electrode 23)). Therefore, power semiconductor module 1 having high performance and low cost can be obtained.

Second Embodiment

Figure 8:
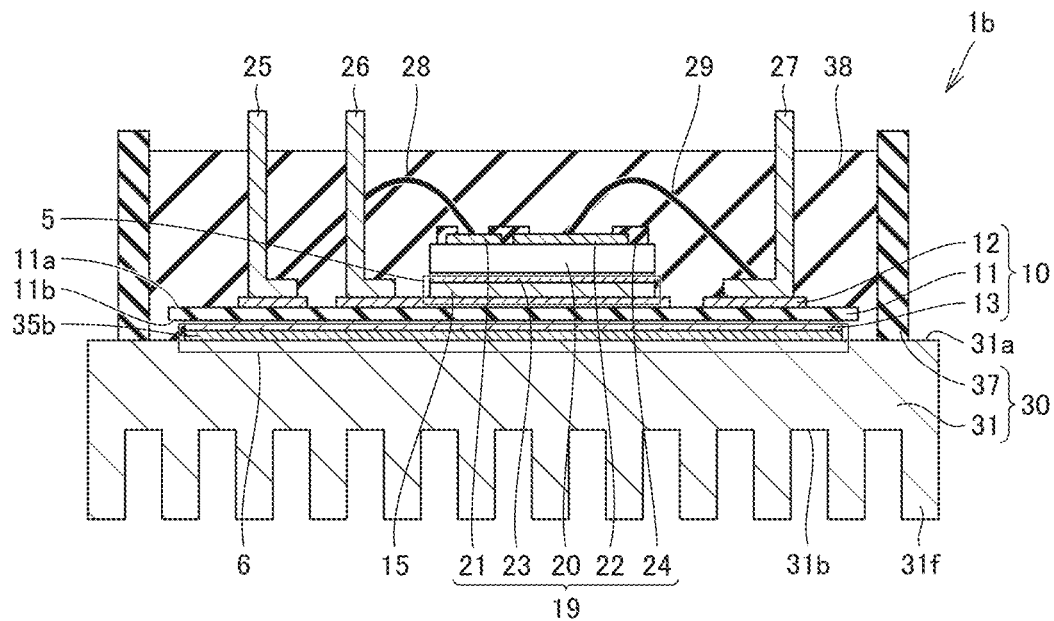
FIG. 8 is a schematic sectional view illustrating a power semiconductor module according to a second embodiment.

With reference to FIG. 8, a power semiconductor module 1b according to a second embodiment will be described. The power semiconductor module 1b of the second embodiment has the same configuration as the power semiconductor module 1 of the first embodiment, but is mainly different in the following points.

In power semiconductor module 1b, back conductor layer 13 is a single layer. In an example of the second embodiment, for example, back conductor layer 13 may be formed of Cu. Back conductor layer 13 may be a laminate like the first embodiment.

In power semiconductor module 1b, circuit substrate 10 is bonded to heat dissipation member 31 using a second bonding layer 35b instead of metal overlay layer 32 and solder layer 35 (see FIG. 2). For example, second bonding layer 35b may have a thickness greater than or equal to 20 μm and less than or equal to 100 μm. Second bonding layer 35b is not particularly limited, but may be formed of a metal nanoparticle sintered body. For example, the metal nanoparticle has a diameter less than or equal to 10 nm. The bonding layer (second bonding layer 35b) formed of the metal nanoparticle sintered body does not contain the void greater than or equal to 0.1 μm. For example, the metal nanoparticle sintered body is obtained by sintering metal nanoparticles such as silver nanoparticles or copper nanoparticles at a low temperature less than or equal to 300° C. in an air atmosphere or a nitrogen atmosphere.

The at least one bonding portion includes a second bonding portion 6. Second bonding portion 6 includes heat dissipation member 31 as the first metal member, back conductor layer 13 as the second metal member, and second bonding layer 35b as the bonding layer. At the identical temperature, the 0.2% offset yield strength of the first metal member (heat dissipation member 31) is smaller than the 0.2% offset yield strength of the second metal member (back conductor layer 13) and is smaller than the shear strength of the bonding layer (second bonding layer 35b). Specifically, at the identical temperature, the 0.2% offset yield strength of the second metal member (back conductor layer 13) may be larger than the shear strength of the bonding layer (second bonding layer 35b). In an example of the second embodiment, heat dissipation member 31 is formed of Al, back conductor layer 13 is formed of Cu, and second bonding layer 35b is formed of a silver nanoparticle sintered body. For example, the shear strength of second bonding layer 35b (silver nanoparticle sintered body) at room temperature is more than 30 MPa and less than or equal to 40 MPa.

The 0.2% offset yield strength of the first metal member (heat dissipation member 31) in second bonding portion 6 may be lower than the 0.2% offset yield strength of the first metal member (circuit pattern 12) in first bonding portion 5. For this reason, when the thermal cycle is applied to power semiconductor module 1b, the crack is generated earlier in the first metal member (heat dissipation member 31) of second bonding portion 6 that is farther away from power semiconductor device 19 than the first metal member (circuit pattern 12) of first bonding portion 5. The time until the crack reaches power semiconductor device 19 can be extended. The life of power semiconductor module 1b can be extended.

For example, the bonding layer (second bonding layer 35b) may have a thickness greater than or equal to 20 μm, or may have a thickness greater than or equal to 35 μm. For this reason, mechanical strength of the bonding layer (second bonding layer 35b) is improved, and the generation of the crack can be prevented in the bonding layer (second bonding layer 35b). Even when the thermal cycle is applied to power semiconductor module 1b, the crack can be selectively generated in the first metal member (heat dissipation member 31) distal to power semiconductor device 19 (semiconductor substrate 20). For example, the bonding layer (second bonding layer 35b) may have a thickness less than or equal to 100 μm, or may have a thickness less than or equal to 50 μm. An increase in cost of power semiconductor module 1b can be suppressed because it is not necessary to form a special bonding layer (second bonding layer 35b).

The method for manufacturing power semiconductor module 1b of the second embodiment includes the same process as the method for manufacturing power semiconductor module 1 of the first embodiment, but is different in the process of bonding circuit substrate 10 to heat dissipation member 31. In the method for manufacturing power semiconductor module 1b of the second embodiment, bonding circuit substrate 10 to heat dissipation member 31 includes bonding back conductor layer 13 of circuit substrate 10 and heat dissipation member 31 (third principal surface 31a) to each other by second bonding layer 35b.

Specifically, a metal nanoparticle paste such as a silver nanoparticle paste is applied onto third principal surface 31a of heat dissipation member 31. For example, the metal nanoparticle paste has a thickness greater than or equal to 20 µm and less than or equal to 100 µm. For example, the metal nanoparticle paste is calcined at a first temperature greater than or equal to 100° C. and less than or equal to 200° C. to obtain a metal nanoparticle calcined body.

Back conductor layer 13 of circuit substrate 10 is placed on the metal nanoparticle calcined body. Back conductor layer 13 of circuit substrate 10 is in contact with the metal nanoparticle calcined body. The load is applied to circuit substrate 10 to position circuit substrate 10 with respect to the metal nanoparticle calcined body. For example, the load is greater than or equal to 1 MPa and less than or equal to 10 MPa. The application of the load to circuit substrate 10 is stopped. For example, the metal nanoparticle calcined body is sintered at a second temperature higher than the first temperature to obtain second bonding layer 35b formed of the metal nanoparticle sintered body. For example, the second temperature may be less than or equal to 300° C., or less than or equal to 250° C. For example, the sintering time at the second temperature is greater than or equal to 5 minutes and less than or equal to 60 minutes. In this way, back conductor layer 13 of circuit substrate 10 is bonded to third principal surface 31a of heat dissipation member 31 by using second bonding layer 35b.

Power semiconductor module 1b of the second embodiment has the following effects in addition to the effects of power semiconductor module 1 of the first embodiment.

Power semiconductor module 1b of the second embodiment further includes heat dissipation member 31. Circuit substrate 10 includes insulating substrate 11, circuit pattern 12, and back conductor layer 13. Insulating substrate 11 includes a first principal surface 11a opposite to power semiconductor device 19 and a second principal surface 11b on an opposite side of first principal surface 11a. Circuit pattern 12 is provided on first principal surface 11a of insulating substrate 11. Back conductor layer 13 is provided on second principal surface 11b of insulating substrate 11. The at least one bonding portion includes a second bonding portion 6. Second bonding portion 6 includes heat dissipation member 31 as the first metal member, back conductor layer 13 as the second metal member, and second bonding layer 35b as the bonding layer.

When power semiconductor device 19 operates, the temperature of power semiconductor module 1b rises, and the first metal member (heat dissipation member 31) and the second metal member (back conductor layer 13) thermally expand. When the temperature of power semiconductor module 1b rises, it can be considered that tensile stress is applied to the first metal member (heat dissipation member 31) and the second metal member (back conductor layer 13). When the first metal member (heat dissipation member 31) is made of a material different from a material of the second metal member (back conductor layer 13), the thermal expansion coefficient of the first metal member (heat dissipation member 31) is different from the thermal expansion coefficient of the second metal member (back conductor layer 13). The shear stress acts on the bonding layer (second bonding layer 35b) because the bonding layer (second bonding layer 35b) is disposed between the first metal member (heat dissipation member 31) and the second metal member (back conductor layer 13).

The 0.2% offset yield strength of the first metal member (heat dissipation member 31) is smaller than the 0.2% offset yield strength of the second metal member (back conductor layer 13) and is smaller than the shear strength of the bonding layer (second bonding layer 35b). For this reason, even when the thermal cycle is applied to power semiconductor module 1b, the crack selectively occurs in the first metal member (heat dissipation member 31) distal to semiconductor substrate 20. The crack is prevented from developing to power semiconductor device 19 through the bonding layer (second bonding layer 35b) and the second metal member (back conductor layer 13). In this way, the generation of the crack can be prevented in power semiconductor device 19. The life of power semiconductor module 1b can be extended.

In power semiconductor module 1b of the second embodiment, the 0.2% offset yield strength of the second metal member (back conductor layer 13) may be larger than the shear strength of the bonding layer (second bonding layer 35b) at the identical temperature. For this reason, even when the crack occurs in the first metal member (heat dissipation member 31) distal to semiconductor substrate 20, the second metal member (back conductor layer 13) can prevent the crack from developing to power semiconductor device 19. In this way, the generation of the crack can be prevented in power semiconductor device 19. The life of power semiconductor module 1b can be extended.

In power semiconductor module 1b of the second embodiment, power semiconductor device 19 further includes the first electrode (drain electrode 23) opposite to the circuit pattern 12. The at least one bonding portion further includes first bonding portion 5. First bonding portion 5 includes circuit pattern 12 as the first metal member, the first electrode (drain electrode 23) as the second metal member, and first bonding layer 15 as the bonding layer.

That is, power semiconductor module 1b includes a plurality of bonding portions (first bonding portion 5; second bonding portion 6). Each of the plurality of bonding portions (first bonding portion 5; second bonding portions 6) includes the first metal member (circuit pattern 12; heat dissipation member 31) distal to semiconductor substrate 20, the second metal member (first electrode (drain electrode 23); back conductor layer 13) proximal to semiconductor substrate 20, the bonding layer (first bonding layer 15; second bonding layer 35b) that bonds the first metal member (circuit pattern 12; heat dissipation member 31) and the second metal member (first electrode (drain electrode 23); back conductor layer 13) to each other. At the identical temperature, the 0.2% offset yield strength of the first metal member (circuit pattern 12; heat dissipation member 31) is smaller than the 0.2% offset yield strength of the second metal member (first electrode (drain electrode 23); back conductor layer 13), and is smaller than the shear strength of the bonding layer (first bonding layer 15; second bonding layer 35b).

Therefore, thermal stress and thermal strain generated in power semiconductor module 1b can be borne by the plurality of bonding portions (first bonding portion 5 and second bonding portion 6). The thermal stress and the thermal strain acting on each of the plurality of bonding portions (first bonding portion 5 and second bonding portion 6) are decreased. It is possible to decrease the development of the crack in the weakest portion of the plurality of bonding portions (first bonding portion 5; second bonding portion 6). The life of power semiconductor module 1b can further be extended.

Third Embodiment

Figure 9:
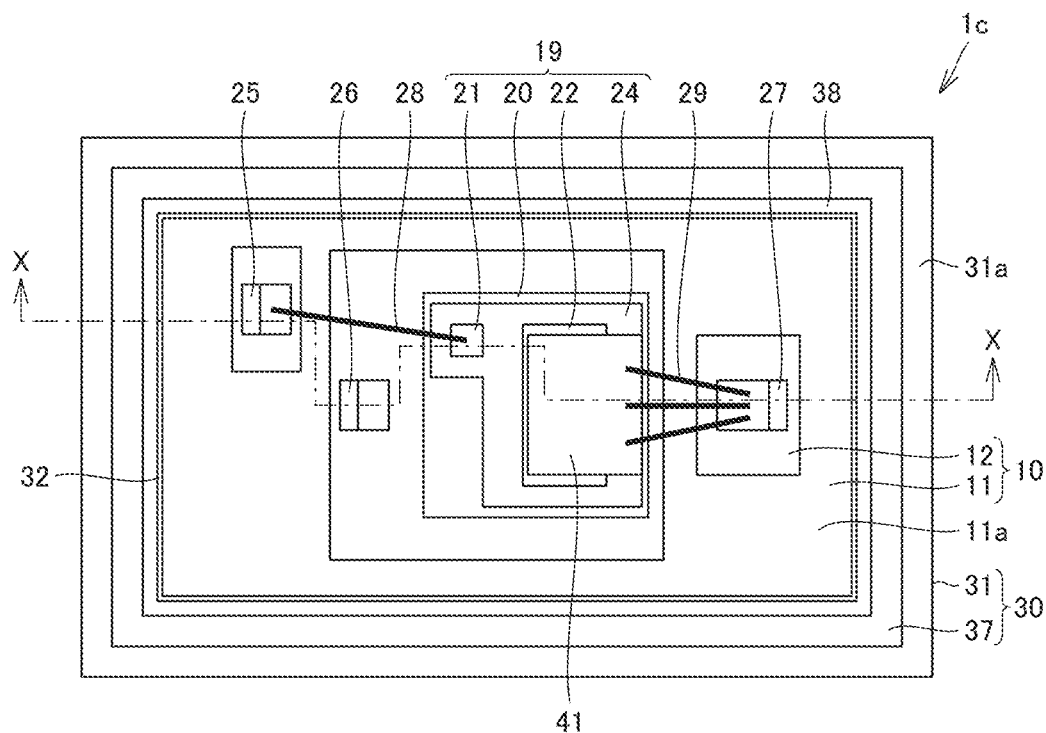
FIG. 9 is a schematic plan view illustrating a power semiconductor module according to a third embodiment.
Figure 10:
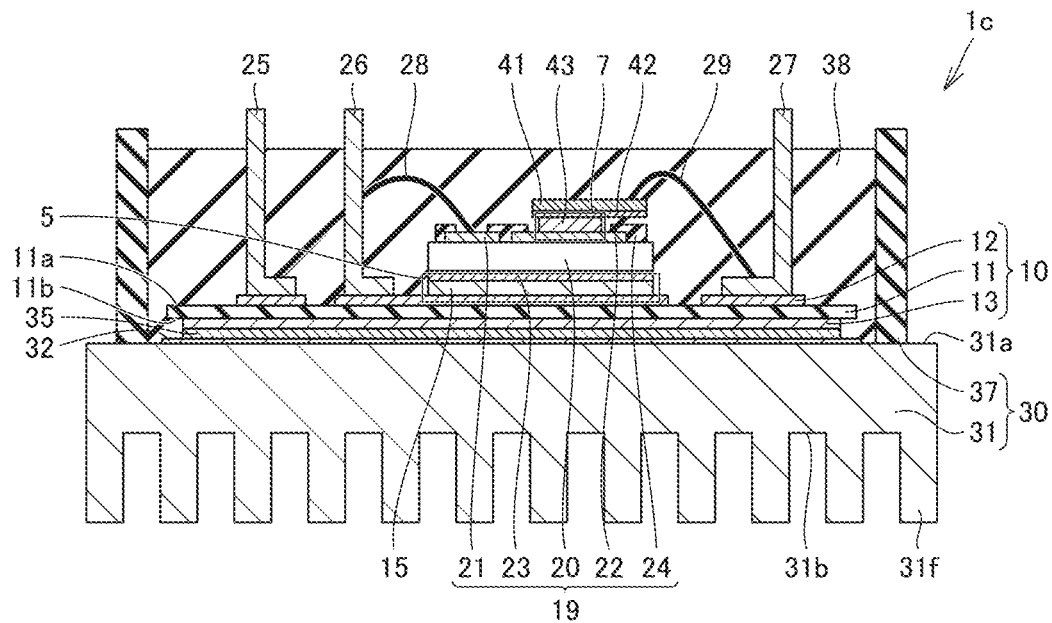
FIG. 10 is a schematic sectional view illustrating the power semiconductor module of the third embodiment, taken along a line X-X in FIG. 9.

With reference to FIGS. 9 and 10, a power semiconductor module 1c of a third embodiment will be described. Power semiconductor module 1c of the third embodiment has the same configuration as power semiconductor module 1 of the first embodiment, but is mainly different in the following points.

Power semiconductor module 1c further includes a conductive pad 41. As illustrated in FIG. 9, in plan view of the second electrode (source electrode 22) (plan view of first principal surface 11a of insulating substrate 11), conductive pad 41 has an area larger than the second electrode (source electrode 22). For this reason, even when conductive wire 29 has a diameter larger than that of conductive wire 28, or even when the number of conductive wires 29 is larger than the number of conductive wires 28, conductive wire 29 can be more easily bonded to conductive pad 41.

Conductive pad 41 has a volume larger than that of the second electrode (source electrode 22). Conductive pad 41 has heat capacity larger than that of the second electrode (source electrode 22). For this reason, the heat generated in power semiconductor device 19 can be radiated from conductive pad 41. Conductive pad 41 is thicker than the second electrode (source electrode 22). For example, conductive pad 41 (excluding an underlayer 42) is formed of Cu. For example, conductive pad 41 (excluding underlayer 42) may have a thickness greater than or equal to 0.1 mm and less than or equal to 2.0 mm.

Conductive pad 41 includes a conductive pad part opposite to power semiconductor device 19. The conductive pad part may be underlayer 42. For example, the conductive pad part (underlayer 42) is formed of Al. Conductive pads 41 may be formed of a single metal material. The thickness of the conductive pad part (underlayer 42) is smaller than the thickness of conductive pad 41 (excluding underlayer 42). For example, the conductive pad part (underlayer 42) may have the thickness greater than or equal to 2 μm and less than or equal to 200 μm.

The at least one bonding portion includes a third bonding portion 7. Third bonding portion 7 includes the conductive pad part (underlayer 42) as the first metal member, the second electrode (source electrode 22) as the second metal member, and a third bonding layer 43 as the bonding layer. For example, third bonding layer 43 may have a thickness greater than or equal to 20 μm and less than or equal to 100 μm. Third bonding layer 43 is not particularly limited, but may be formed of the metal nanoparticle sintered body. For example, the metal nanoparticle has a diameter less than or equal to 10 nm. The bonding layer (third bonding layer 43) formed of the metal nanoparticle sintered body does not contain a void greater than or equal to 0.1 μm. For example, the metal nanoparticle sintered body is obtained by sintering metal nanoparticles such as silver nanoparticles or copper nanoparticles at a low temperature less than or equal to 300° C. in an air atmosphere or a nitrogen atmosphere.

At the identical temperature, the 0.2% offset yield strength of the first metal member (conductive pad part (underlayer 42)) is smaller than the 0.2% offset yield strength of the second metal member (second electrode (source electrode 22)), and is smaller than the shear strength of the bonding layer (third bonding layer 43). Specifically, at the identical temperature, the 0.2% offset yield strength of the second metal member (second electrode (source electrode 22)) may be larger than the shear strength of the bonding layer (third bonding layer 43). In an example of the third embodiment, the conductive pad part (underlayer 42) is formed of Al, the second electrode (source electrode 22) is formed of AlSi (1 wt % of Si), and third bonding layer 43 is formed of the silver nanoparticle sintered body. The shear strength of third bonding layer 43 (silver nanoparticle sintered body) at room temperature is more than 30 MPa and less than or equal to 40 MPa.

For example, the bonding layer (third bonding layer 43) may have a thickness greater than or equal to 20 μm, or greater than or equal to 35 μm. For this reason, the mechanical strength of the bonding layer (third bonding layer 43) is improved, and the occurrence of the crack can be suppressed in the bonding layer (third bonding layer 43). Even when the thermal cycle is applied to the power semiconductor module 1c, the crack can selectively occur in the first metal member (conductive pad part (underlayer 42)) distal to semiconductor substrate 20. For example, the bonding layer (third bonding layer 43) may have a thickness less than or equal to 100 μm, or may have a thickness less than or equal to 50 μm. The increase in cost of power semiconductor module 1c can be suppressed because it is not necessary to form a special bonding layer (third bonding layer 43).

The method for manufacturing power semiconductor module 1c of the third embodiment includes the same process as the method for manufacturing power semiconductor module 1 of the first embodiment, but is mainly different from the method for manufacturing power semiconductor module 1 of the first embodiment in the following points. The method for manufacturing power semiconductor module 1c of the third embodiment further includes bonding conductive pad 41 to power semiconductor device 19 using third bonding layer 43. After power semiconductor device 19 is bonded to circuit pattern 12 using first bonding layer 15, conductive pad 41 may be bonded to power semiconductor device 19 using third bonding layer 43. Before lead terminals 25, 26, 27 are bonded to circuit pattern 12, conductive pad 41 may be bonded to power semiconductor device 19 using third bonding layer 43.

Specifically, the metal nanoparticle paste such as the silver nanoparticle paste is applied onto the second electrode (source electrode 22) of power semiconductor device 19. For example, the metal nanoparticle paste has a thickness greater than or equal to 20 μm and less than or equal to 100 μm. For example, the metal nanoparticle paste is calcined at a first temperature greater than or equal to 100° C. and less than or equal to 200° C. to obtain a metal nanoparticle calcined body.

Conductive pad 41 is placed on the metal nanoparticle calcined body. The conductive pad part (underlayer 42) is in contact with the metal nanoparticle calcined body. The load is applied to conductive pad 41 to position conductive pad 41 with respect to the metal nanoparticle calcined body. For example, the load is greater than or equal to 1 MPa and less than or equal to 10 MPa. The application of the load to conductive pad 41 is stopped. For example, the metal nanoparticle calcined body is sintered at a second temperature higher than the first temperature to obtain third bonding layer 43 formed of the metal nanoparticle sintered body. For example, the second temperature may be less than or equal to 300° C., or less than or equal to 250° C. For example, the sintering time at the second temperature is greater than or equal to 5 minutes and less than or equal to 60 minutes. In this way, the conductive pad part (underlayer 42) of conductive pad 41 is bonded to the second electrode (source electrode 22) of power semiconductor device 19 using third bonding layer 43.

The method for manufacturing power semiconductor module 1c of the third embodiment includes bonding conductive wire 29 not to the second electrode (source electrode 22) of power semiconductor device 19 but to conductive pad 41.

The effect of power semiconductor module 1c of the third embodiment will be described.

Power semiconductor module 1c of the third embodiment further includes conductive pad 41 including the conductive pad part (underlayer 42) opposite to power semiconductor device 19. Power semiconductor device 19 further includes the second electrode (source electrode 22) provided on the distal side of circuit substrate 10. In plan view of the second electrode (source electrode 22), conductive pad 41 has an area larger than that of the second electrode (source electrode 22). The at least one bonding portion includes a third bonding portion 7. Third bonding portion 7 includes the conductive pad part (underlayer 42) as the first metal member, the second electrode (source electrode 22) as the second metal member, and a third bonding layer 43 as the bonding layer.

When power semiconductor device 19 operates, the temperature of power semiconductor module 1c rises, and the first metal member (conductive pad part (underlayer 42)) and the second metal member (second electrode (source electrode 22)) thermally expand. When the temperature of power semiconductor module 1c rises, it can be considered that tensile stress is applied to the first metal member (conductive pad part (underlayer 42)) and the second metal member (second electrode (source electrode 22)). When the first metal member (conductive pad part (underlayer 42)) is made of a material different from a material of the second metal member (second electrode (source electrode 22)), the thermal expansion coefficient of the first metal member (conductive pad part (underlayer 42)) is different from the thermal expansion coefficient of the second metal member (second electrode (source electrode 22)). The shear stress acts on the bonding layer (third bonding layer 43) because the bonding layer (third bonding layer 43) is disposed between the first metal member (conductive pad part (underlayer 42)) and the second metal member (second electrode (source electrode 22)).

The 0.2% offset yield strength of the first metal member (conductive pad part (underlayer 42)) is smaller than the 0.2% offset yield strength of the second metal member (second electrode (source electrode 22)), and is smaller than the shear strength of the bonding layer (third bonding layer 43). For this reason, even when the thermal cycle is applied to power semiconductor module 1c, the crack is selectively generated in the first metal member (conductive pad part (underlayer 42)) distal to semiconductor substrate 20. The crack is prevented from developing to power semiconductor device 19 through the bonding layer (third bonding layer 43). In this way, the generation of the crack can be prevented in power semiconductor device 19. The life of the power semiconductor module 1c can be extended.

In power semiconductor module 1c of the third embodiment, the 0.2% offset yield strength of the second metal member (second electrode (source electrode 22)) may be larger than the shear strength of the bonding layer (third bonding layer 43) at the identical temperature. For this reason, even when the crack is generated in the first metal member (conductive pad part (underlayer 42)) distal to semiconductor substrate 20, the second metal member (second electrode (source electrode 22)) can prevent the crack from spreading to power semiconductor device 19. In this way, the generation of the crack can be prevented in power semiconductor device 19. The life of the power semiconductor module 1c can be extended.

In plan view of the second electrode (source electrode 22), conductive pad 41 has an area larger than that of the second electrode (source electrode 22). For this reason, even when the diameter of conductive wire 29 is increased, conductive wire 29 can be easily bonded to conductive pad 41. An electrical resistance at a connection portion between the second electrode (source electrode 22) and conductive wire 29 can be decreased by increasing the diameter of conductive wire 29. The heat generated at the connection portion can be decreased. The thermal stress and thermal strain generated in power semiconductor module 1c during the thermal cycle can be decreased. The life of the power semiconductor module 1c can be extended.

Conductive pad 41 radiates heat generated in power semiconductor device 19 to an outside of power semiconductor device 19. The temperature during the operation of power semiconductor device 19 can be decreased. When the temperature of power semiconductor device 19 decreases, short-circuit tolerance of power semiconductor device 19 is improved. For this reason, the life of power semiconductor module 1c can be extended.

In power semiconductor module 1c of the third embodiment, power semiconductor device 19 further includes the first electrode (drain electrode 23) opposite to circuit pattern 12. The at least one bonding portion further includes first bonding portion 5. First bonding portion 5 includes circuit pattern 12 as the first metal member, the first electrode (drain electrode 23) as the second metal member, and first bonding layer 15 as the bonding layer.

That is, power semiconductor module 1c includes a plurality of bonding portions (first bonding portion 5; third bonding portion 7). Each of the plurality of bonding portions (first bonding portion 5; third bonding portion 7) includes the first metal member (circuit pattern 12) distal to semiconductor substrate 20; the conductive pad part (underlayer 42)), the second metal member (first electrode (drain electrode 23); back conductor layer 13) proximal to semiconductor substrate 20; and the bonding layer (first bonding layer 15; second bonding layer 35b) that bonds the first metal member (circuit pattern 12; heat dissipation member 31) and the second metal member (first electrode (drain electrode 23); second electrode (source electrode 22)) to each other. At the identical temperature, the 0.2% offset yield strength of the first metal member (circuit pattern 12; the conductive pad part (underlayer 42)) is smaller than the 0.2% offset yield strength of the second metal member (first electrode (drain electrode 23); second electrode (source electrode 22)), and is smaller than the shear strength of the bonding layer (first bonding layer 15; third bonding layer 43).

For this reason, the thermal stress and thermal strain generated in power semiconductor module 1c can be borne by the plurality of bonding portions (first bonding portion 5 and third bonding portion 7). The thermal stress and thermal strain acting on each of the plurality of bonding portions (first bonding portion 5 and third bonding portion 7) are reduced. It is possible to decrease the development of the crack in the weakest portion of the plurality of bonding portions (first bonding portion 5; third bonding portion 7). The life of power semiconductor module 1c can further be extended.

Fourth Embodiment

Figure 11:
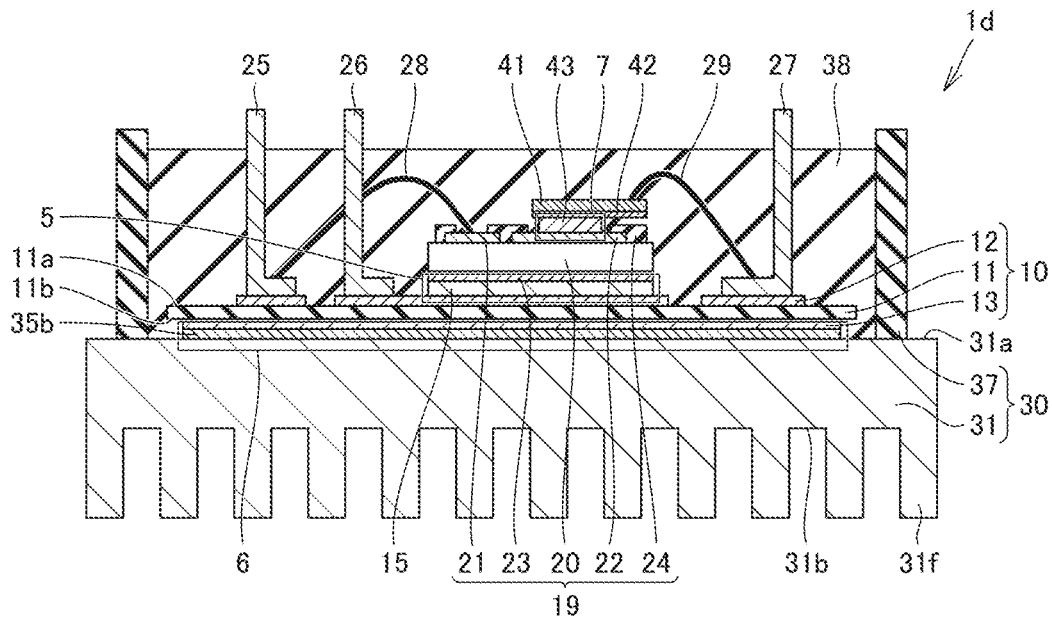
FIG. 11 is a schematic sectional view illustrating a power semiconductor module according to a fourth embodiment.

With reference to FIG. 11, a power semiconductor module 1d according to a fourth embodiment will be described. Power semiconductor module 1d of the fourth embodiment has the same configuration as power semiconductor module 1b of the second embodiment, but is mainly different from power semiconductor module 1b of the second embodiment in the following points. Power semiconductor module 1d further includes conductive pad 41 similarly to the third embodiment. In power semiconductor module 1d, conductive pad 41 is bonded to the second electrode (source electrode 22) of power semiconductor device 19 using third bonding layer 43 of the third embodiment. In power semiconductor module 1d, conductive wire 29 is bonded to conductive pad 41 similarly to the third embodiment.

The method for manufacturing power semiconductor module 1d of the fourth embodiment includes the same process as the method for manufacturing power semiconductor module 1b of the second embodiment, but is mainly different from manufacturing power semiconductor module 1b of the second embodiment in the following points. The method for manufacturing power semiconductor module 1d of the fourth embodiment further includes bonding conductive pad 41 to power semiconductor device 19 using third bonding layer 43 similarly to the third embodiment. The method for manufacturing power semiconductor module 1d of the fourth embodiment includes bonding conductive wire 29 to conductive pad 41 similarly to the third embodiment.

Power semiconductor module 1d of the fourth embodiment has the following effects in addition to the effects of power semiconductor modules 1, 1b, 1c of the first to third embodiments. In power semiconductor module 1d of the fourth embodiment, the thermal stress and thermal strain generated in power semiconductor module 1d can be borne by the plurality of bonding portions (first bonding portion 5, second bonding portion 6, and third bonding portion 7). The thermal stress and thermal strain acting on each of the plurality of bonding portions (first bonding portion 5, second bonding portion 6, and third bonding portion 7) are decreased. For this reason, it is possible to decrease the development of the crack in the weakest portion of the plurality of bonding portions (first bonding portion 5, second bonding portion 6, and third bonding portion 7). The life of power semiconductor module 1d can further be extended.

Fifth Embodiment

The present embodiment is an application of power semiconductor module 1, 1b, 1c, 1d according to any one of embodiments 1 to 4 to a power conversion apparatus. An example in which a power conversion apparatus 200 in the present embodiment is a three-phase inverter will be described below, although the power conversion apparatus is not particularly limited.

Figure 12:
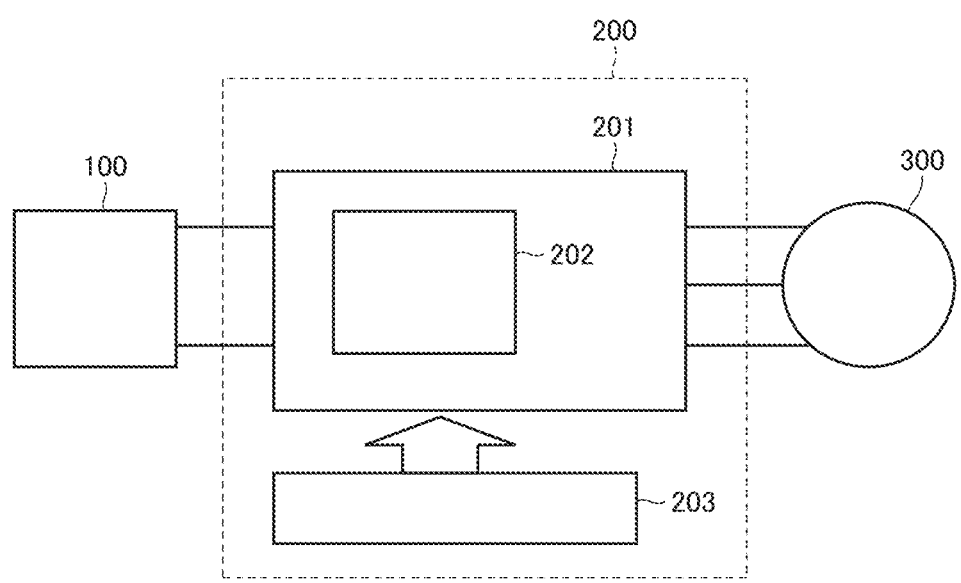
FIG. 12 is a block diagram illustrating a configuration of a power conversion system according to a fifth embodiment.

The power conversion system in FIG. 12 includes a power supply 100, power conversion apparatus 200, and a load 300. Power supply 100 is a DC power supply, and supplies DC power to power conversion apparatus 200. Power supply 100 is not particularly limited, but may be constructed with a DC system, a solar cell, or a storage battery, or constructed with a rectifier circuit or an AC-DC converter connected to an AC system. Power supply 100 may be constructed with a DC-DC converter that converts the DC power output from the DC system into other DC power.

Power conversion apparatus 200 is a three-phase inverter connected between power supply 100 and load 300, converts the DC power supplied from power supply 100 into AC power, and supplies the AC power to load 300. As illustrated in FIG. 12, power conversion apparatus 200 includes a main conversion circuit 201 that converts the DC power into the AC power to output the AC power and a control circuit 203 that outputs a control signal controlling main conversion circuit 201 to main conversion circuit 201.

Load 300 is a three-phase motor driven by the AC power supplied from power conversion apparatus 200. Load 300 is not particularly limited, but is a motor mounted on various electric appliances. For example, load 300 is used as a hybrid car, an electric car, a railway vehicle, an elevator, or a motor for an air conditioner.

Power conversion apparatus 200 will be described in detail below. Main conversion circuit 201 includes a switching element (not illustrated) and a reflux diode (not illustrated). The switching element switches voltage supplied from power supply 100, whereby main conversion circuit 201 converts the DC power supplied from power supply 100 into the AC power to supply the AC power to load 300. Although there are various specific circuit configurations of main conversion circuit 201, main conversion circuit 201 of the fifth embodiment is a two-level three-phase full bridge circuit, and can be constructed with six switching elements and six reflux diodes connected in reversely parallel to six switching elements. Any one of power semiconductor modules 1, 1b, 1c, 1d of the first to fourth embodiments is applied to at least one of the switching elements and the reflux diode of main conversion circuit 201. The six switching elements are connected in series in every two switching elements to constitute upper and lower arms, and each of the upper and lower arms constitutes each phase (U-phase, V-phase, and W-phase) of a full bridge circuit. An output terminal of each of the upper and lower arms, namely, three output terminals of main conversion circuit 201 are connected to load 300.

Main conversion circuit 201 includes a drive circuit (not illustrated) that drives each switching element. The drive circuit may be incorporated in a semiconductor module 202, or provided separately from semiconductor module 202. The drive circuit generates a drive signal driving the switching element included in main conversion circuit 201, and supplies the drive signal to a control electrode of the switching element of main conversion circuit 201. Specifically, the drive signal turning on the switching element and the drive signal turning off the switching element are output to the control electrode of each switching element according to the control signal from control circuit 203. The drive signal is a voltage signal (ON signal) greater than or equal to a threshold voltage of the switching element when the switching element is maintained in an ON state, and the drive signal is a voltage signal (OFF signal) equal to or smaller than the threshold voltage of the switching element when the switching element is maintained in an OFF state.

Control circuit 203 controls the switching elements of main conversion circuit 201 so that desired power is supplied to load 300. Specifically, time (ON time) during which each switching element of main conversion circuit 201 is to be turned on is calculated based on the power to be supplied to load 300. For example, main conversion circuit 201 can be controlled by pulse width modulation (PWM) control that modulates the ON time of the switching element according to the voltage to be output. A control command (control signal) is output to the drive circuit included in main conversion circuit 201 such that the ON signal is output to the switching element to be turned on at each time point, and such that the OFF signal is output to the switching element to be turned off at each time point. The drive circuit outputs the ON signal or the OFF signal as the drive signal to the control electrode of each switching element according to the control signal.

In power conversion apparatus 200 of the fifth embodiment, any one of power semiconductor modules 1, 1b, 1c, 1d of the first to fourth embodiments is applied as semiconductor module 202 included in main conversion circuit 201. Therefore, power conversion apparatus 200 according to the fifth embodiment has improved reliability.

Although the example in which the present invention is applied to the two-level three-phase inverter is described in the fifth embodiment, the present invention is not limited to the fifth embodiment, but can be applied to various power conversion apparatuses. Although the two-level power conversion apparatus is used in the fifth embodiment, a three-level power conversion apparatus or a multi-level power conversion apparatus may be used. When the power conversion apparatus supplies the power to a single-phase load, the present invention may be applied to a single-phase inverter. When the power conversion apparatus supplies the power to a DC load or the like, the present invention may be applied to a DC-DC converter or an AC-DC converter.

The power conversion apparatus to which the present invention is applied is not limited to the case that the load is the motor. For example, the power conversion apparatus may be incorporated in a power supply device of an electric discharge machine or a laser processing machine or a power supply device of an induction heating cooker or a noncontact power supply system. The power conversion apparatus to which the present invention is applied can be used as a power conditioner of a solar power generation system or a storage system.

It should be considered that the disclosed first to fifth embodiments are examples in all respects, and not restrictive. As long as there is no contradiction, at least two of the disclosed first to fifth embodiments may be combined. The scope of the present invention is defined by not the above description but the claims, and it is intended that all modifications within the meaning and scope of the claims are included in the present invention.

REFERENCE SIGNS LIST

1, 1b, 1c, 1d: power semiconductor module, 5: first bonding portion, 6: second bonding portion, 7: third bonding portion, 10: circuit substrate, 11: insulating substrate, 11a: first principal surface, 11b: second principal surface, 12: circuit pattern, 13: back conductor layer, 15: first bonding layer, 19: power semiconductor device, 20: semiconductor substrate, 21: gate electrode, 22: source electrode, 23: drain electrode, 24: insulation film, 25, 26, 27: lead terminal, 28, 29: conductive wire, 30: case, 31: heat dissipation member, 31a: third principal surface, 31b: fourth principal surface, 31f: fin, 32: metal overlay layer, 35: solder layer, 35b: second bonding layer, 37: enclosure, 38: sealing member, 41: conductive pad, 42: underlayer, 43: third bonding layer, 100: power supply, 200: power conversion apparatus, 201: main conversion circuit, 202: semiconductor module, 203: control circuit, 300: load

The invention claimed is:

1. A power semiconductor module comprising:
    a circuit substrate;
    a power semiconductor device including a semiconductor substrate; and
    at least one bonding portion,
    wherein
    the at least one bonding portion includes a first metal member distal to the semiconductor substrate, a second metal member proximal to the semiconductor substrate, and a bonding layer that bonds the first metal member and the second metal member to each other, and
    at an identical temperature, 0.2% offset yield strength of the first metal member is smaller than the 0.2% offset yield strength of the second metal member and is smaller than shear strength of the bonding layer.

2. The power semiconductor module according to claim 1, wherein the 0.2% offset yield strength of the second metal member is larger than the shear strength of the bonding layer at the identical temperature.

3. The power semiconductor module according to claim 1, wherein
    the circuit substrate includes a circuit pattern,
    the power semiconductor device further includes a first electrode opposite to the circuit pattern,
    the at least one bonding portion includes a first bonding portion, and
    the first bonding portion includes the circuit pattern as the first metal member, the first electrode as the second metal member, and a first bonding layer as the bonding layer.

4. The power semiconductor module according to claim 1, further comprising a heat dissipation member,
    wherein
    the circuit substrate includes an insulating substrate, a circuit pattern, and a back conductor layer,
    the insulating substrate includes a first principal surface opposite to the power semiconductor device and a second principal surface on an opposite side of the first principal surface,
    the circuit pattern is provided on the first principal surface,
    the back conductor layer is provided on the second principal surface,
    the at least one bonding portion includes a second bonding portion, and
    the second bonding portion includes the heat dissipation member as the first metal member, the back conductor layer as the second metal member, and a second bonding layer as the bonding layer.

5. The power semiconductor module according to claim 4, wherein
    the power semiconductor device further includes a first electrode opposite to the circuit pattern,
    the at least one bonding portion further includes a first bonding portion, and
    the first bonding portion includes the circuit pattern as the first metal member, the first electrode as the second metal member, and a first bonding layer as the bonding layer.

6. The power semiconductor module according to claim 1, further comprising a conductive pad including a conductive pad part opposite to the power semiconductor device,
    wherein
    the power semiconductor device further includes a second electrode provided on a distal side from the circuit substrate,
    in a plan view of the second electrode, the conductive pad has an area larger than an area of the second electrode,
    the at least one bonding portion includes a third bonding portion, and
    the third bonding portion includes the conductive pad part as the first metal member, the second electrode as the second metal member, and a third bonding layer as the bonding layer.

7. The power semiconductor module according to claim 1, wherein the bonding layer is formed of a metal nanoparticle sintered body.

8. The power semiconductor module according to claim 1, wherein
    the first metal member is made of Al, and the second metal member is made of AlSi, AlCu, AlSiCu, or Cu.

9. A power conversion apparatus comprising:
a main conversion circuit including the power semiconductor module according to claim 1, wherein the main conversion circuit converts input power and outputs the converted power; and
a control circuit to output, to the main conversion circuit, a control signal for controlling the main conversion circuit.

* * * * *